United States Patent [19]

Tollum

[11] Patent Number: 5,384,790
[45] Date of Patent: Jan. 24, 1995

[54] MAGNETIC RECORDING SYSTEM WITH PULSE QUALIFICATION AND ERROR CORRECTION CIRCUITRY

[75] Inventor: Ronald E. Tollum, Simi Valley, Calif.

[73] Assignee: Wangtek, Inc., Simi Valley, Calif.

[21] Appl. No.: 141,463

[22] Filed: Oct. 22, 1993

Related U.S. Application Data

[63] Continuation of Ser. No. 797,739, Nov. 22, 1991, abandoned.

[51] Int. Cl.⁶ ..................... G11B 5/09; H03M 13/00
[52] U.S. Cl. ................................. 371/40.1; 371/55
[58] Field of Search ............... 371/55, 40.1, 57.2, 371/52; 360/40; 341/94, 58, 59

[56] References Cited

U.S. PATENT DOCUMENTS 3,639,900  2/1972  Hintz, Jr. ...................... 371/40.1
4,823,208  4/1989  Ouchi et al. ...................... 360/46

OTHER PUBLICATIONS

Bergmann et al, "Half weight block codes for optical communications", AT&T Technical Journal, vol. 65, issue 3, May/Jun. 1986, pp. 85–93.

Primary Examiner—Hoa T. Nguyen
Attorney, Agent, or Firm—Robbins, Berliner and Carson

[57] ABSTRACT

Special tape drive read circuitry generally qualifies read voltage peaks by establishing a minimum amplitude for valid peaks in the read voltage signal so that noise is not interpreted as peaks, but does not require amplitude qualification during periods of dropout in the read voltage signal. Additional circuitry recognizes two of the data errors most common to GCR, and allows for these errors to be corrected. The first kind of error is the tri-bit error, in which 01110 is misinterpreted as 01000. The other kind of error is the low frequency error, in which 10010 is misinterpreted as 11000. Also, the type of error detected is used to adjust the read drive's hysteresis setting, to reduce future errors of the same type.

11 Claims, 7 Drawing Sheets 0   1   1   1   0

0   1   0   0   0

1    0    0    1    0

1    1    0    0    0

MAGNETIC RECORDING SYSTEM WITH PULSE QUALIFICATION AND ERROR CORRECTION CIRCUITRY

This application is a continuation of application of Ser. No. 07/797,739 filed on Nov. 22, 1991, now abandoned.

BACKGROUND OF THE INVENTION

This invention relates generally to reading information from magnetic media, specifically to detecting read errors and correcting for them when reading from magnetic tapes using the Group Code Recording (GCR) method.

One of the common data storage media used by computer systems is magnetic tapes. In commonly used recording formats magnetic tapes have several parallel data tracks running the length of the tape, and data is written serially along each track by altering the direction of magnetic flux on the tape. Two directions are employed, e.g., "left" and "right". A reversal of flux direction at a particular point on the tape indicates a "1" data bit, and a continuation of the same flux direction at that point indicates a data "0" bit. The read head is sensitive to flux reversals and converts them to a voltage signal which has peaks for each reversal. This signal has positive peaks for flux reversals of one type (such as changing from left to right) and negative peaks for flux reversals of opposite type (right to left). Because of this, an ideal voltage signal from the read head consists of alternating positive and negative peaks, indicating 1s, separated by stretches of zero voltage, indicating 0s. Peak detection circuitry analyzes the read voltage signal and produces corresponding digital data bits of 1s and 0s. For various reasons, however, the peak detection circuitry may not always properly detect a peak, resulting in reading incorrect digital data.

Generally, the peak detection circuitry is designed to look for peaks having a certain minimum amplitude and alternating in sign (e.g., positive/negative), because a proper signal is characterized by such alternating paeks, as described above. This means that if one peak is missed for some reason, the next peak will be missed as well, because it will have the opposite polarity expected by the peak detection circuitry. Thus, two extra 0s will be indicated where there should have been 1s. This characteristic can be taken advantage of, as noted below. Other errors include the missing of peaks during "dropout" periods of low peak amplitude, and the detection of peaks where they should not properly have been. This latter error is generally due to excessive noise. It is known in the prior art to reduce such erroneous peak detection due to noise by using amplitude qualification circuitry that requires a peak to have a minimum amplitude.

One common method for detecting when data read errors occur is to use Run Length Limited (RLL) encoding, which limits the minimum and maximum allowable number of 0s between 1s. RLL codes are specified by two numbers (m,n), where m specifies the minimum number of 0s between 1s, and where n specifies the maximum number of 0s between 1s. Group Code Recording (GCR) is a (0,2) RLL code. Under the GCR method, data to be written is grouped into four-bit nibbles which are then encoded into five-bit run length codes, shown in Table 1.

TABLE I

| Group Code Recording | | | |
|---|---|---|---|
| Data Nibble | Run-length Code | Data Nibble | Run-length Code |
| 0000 | 11001 | 1000 | 11010 |
| 0001 | 11011 | 1001 | 01001 |
| 0010 | 10010 | 1010 | 01010 |
| 0011 | 10011 | 1011 | 01011 |
| 0100 | 11101 | 1100 | 11110 |
| 0101 | 10101 | 1101 | 01101 |
| 0110 | 10110 | 1110 | 01110 |
| 0111 | 10111 | 1111 | 01111 |

With GCR the encoded data has the property that a valid sequence of bits will not contain more than two contiguous 0s. A typical read error involves a missed peak and will substitute two 0s for two 1s, meaning that these errors will result in at least three contiguous 0s. This allows error detection circuitry coupled to the read head to search for three contiguous 0s and signal an error if such is found. Unfortunately, standard RLL encoding does not contain any provisions for error correction.

SUMMARY OF THE INVENTION

The present invention provides a method and apparatus for detecting and correcting common classes of errors which occur under Run Length Limited (RLL) digital recording techniques. According to one aspect of the present invention read voltage peaks are generally qualified by establishing a minimum amplitude for valid peaks in the read voltage signal so that noise is not interpreted as peaks, but amplitude qualification may not be desired during periods of "dropout" in the read voltage signal. According to another aspect of the present invention, two of the data errors most common to RLL encoding are recognized and corrected. The first kind of error is an isolated tri-bit error, in which for a type of RLL encoding known as GCR, for example, 01110 is misinterpreted as 01000. The other kind of error is a low frequency error, which for GCR occurs when 10010 is misinterpreted as 11000. According to yet another aspect of the invention adjustments are made to the read circuitry, based on the type of error detected, to minimize the occurence of future errors of the same type.

A better understanding of the nature and advantages of the invention may be realized by reference to the remaining portions of the specification and the drawings.

DETAILED DESCRIPTION OF SPECIFIC EMBODIMENTS

Figure 1:
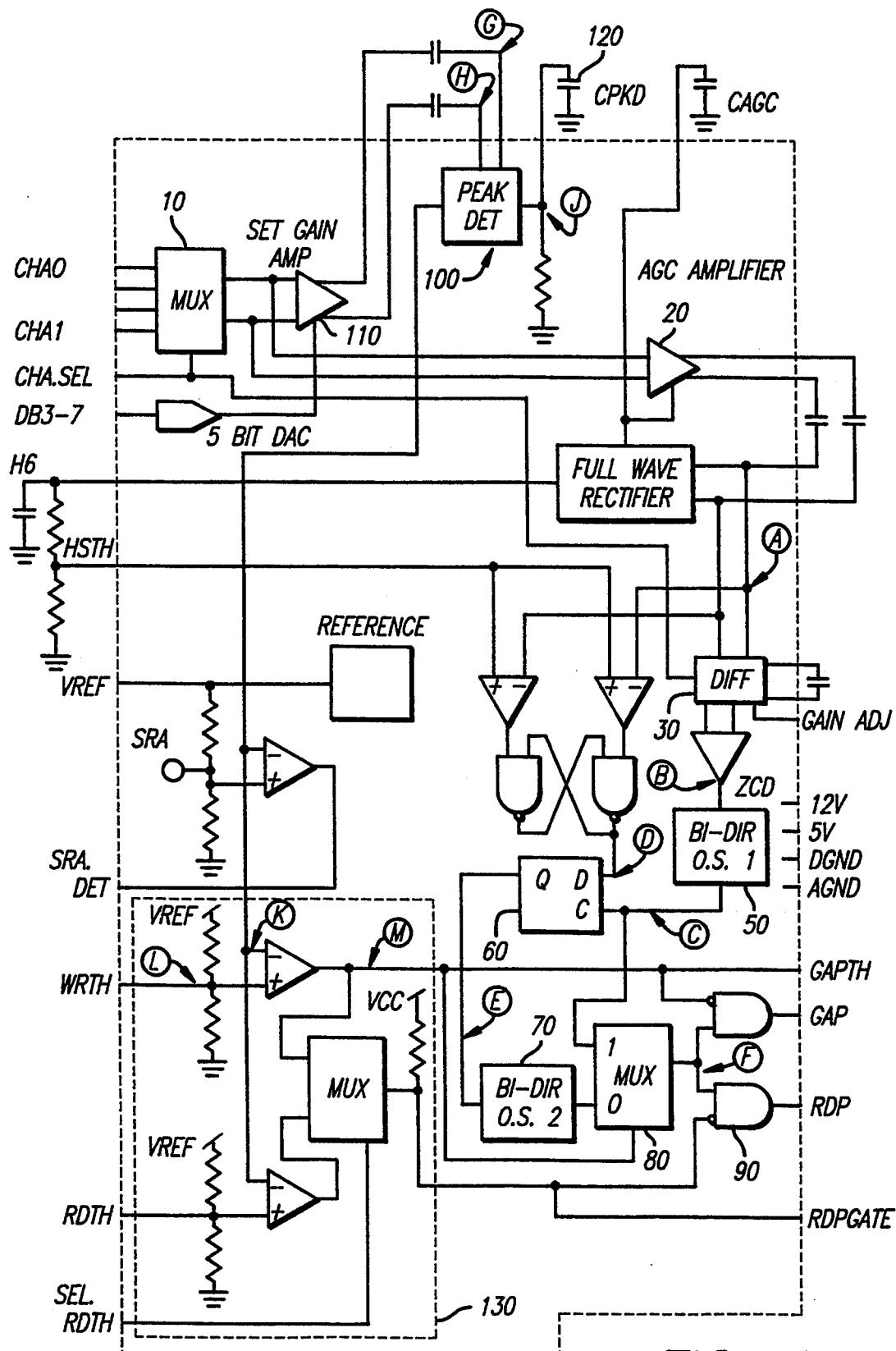
FIG. 1 is a block diagram of a circuit for processing analog/read voltage signals to produce a digital read data pulse signal.

The reading of Run Length Limited (RLL) data is frequently done with a pulse amplitude qualifying circuit. The qualifying circuit operates to distinguish valid read pulses from noise. The qualifying level may be set as a fixed value, or it may be dependent on the amplitude of preceding pulses. In this latter case, the threshold level may be called a hysteresis threshold, and might be expressed as a percentage. For example, a hysteresis setting of 70% would mean that a pulse would have to have an amplitude equal to or greater than 70% of the amplitude of the previous pulse to qualify.

The optimum hysteresis level for an amplitude qualifying circuit is dependent upon the signal resolution of the tape drive (or disk drive, etc.) being used. The resolution of the read signal provides an indication of the degree to which adjacent read peaks or "pulses" interfere with each other; this depends on the pulse width and the spacing on the medium between pulses. Resolution may be determined by measuring the amplitudes both of a read signal that was recorded with all of the pulses at minimum spacing (highest frequency) for the particular RLL code and of a read signal that was recorded with all of the pulses at maximum spacing (lowest frequency). The amplitude of the higher frequency recording will normally be the lesser. Resolution is then defined as the ratio of high frequency amplitude to low frequency amplitude. Signals with low resolution are likely to have lower amplitudes during high frequency bit patterns and should have lower hysteresis levels; signals with high resolution are likely to have higher overshoot amplitudes and should have higher hysteresis levels. For GCR the patterns for which high frequency pulse attenuation and low frequency overshoot errors are most likely to occur are 01110 (isolated tri-bit) and 10010 (low frequency), respectively. Other RLL codes also have corresponding patterns; for a (1,3) code, for example, the tri-bit and low frequency patterns are 00010101000 and 100010001, respectively.

The hysteresis level for an amplitude qualifying circuit should therefore be set at an intermediate level between that necessary to correctly process low resolution signals and high resolution signals. For the preferred embodiment, which is described with respect to the Group Code Recording technique (GCR), 47% is a suitable hysteresis setting. Signals with resolution between approximately 38% and 90%, before being processed by any pulse slimming filters, should generally be read error free.

On some occasions, however, a signal will go through a phase called "dropout", where the signal contains valid data whose peaks are dramatically lower than the surrounding peaks. Signal resolution tends to be lower during periods of dropout. Indeed, resolution can become so poor that even bit patterns other than the tri-bit pattern may have bits that fail to qualify. The peaks that occur during a dropout therefore might not be registered, because the amplitude qualifying circuitry might not recognize them as valid peaks. One aspect of the present invention is directed to solving this problem by recognizing periods of dropout and bypassing the amplitude qualifying circuitry (equivalent to a zero hysteresis level) during such periods.

Figure 2:
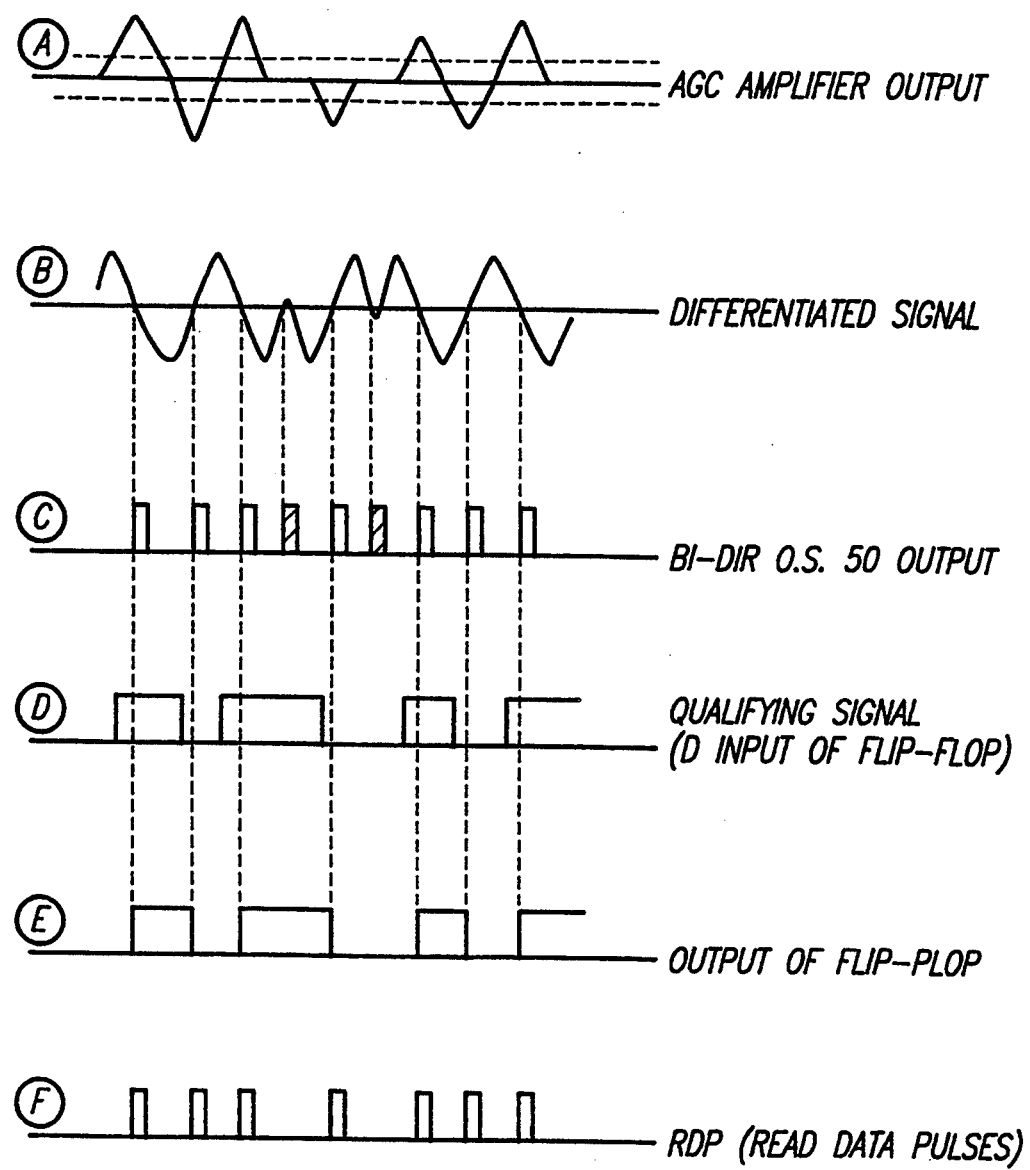
FIG. 2 shows signal waveforms at selected points of the circuit of FIG. 1.

FIG. 1 shows a block diagram of a presently preferred circuit for processing analog read voltage signals to produce a digital read data pulse signal; examples of signal waveforms at designated points A–F in the circuit are shown in FIG. 2. A conventional multiplexor (mux) 10 selects one pair of read voltage signals from CHA0 and CHA1; the selected pair goes on to a conventional AGC amplifier 20. Output A of AGC amplifier 20 is fed to a differentiator 30 which produces differentiated signal B. Signal B then is input to a Zero Crossing Detector (ZCD) 40. The output of ZCD 40 is connected to a Bi-Directional One Shot multivibrator (Bi-Dir OS) 50. The Bi-Dir OS 50 produces an output signal C, which, as shown in FIG. 2, has a pulse, the leading edge of which corresponds in time to each positive or negative peak of signal A, whether qualified or not. Output C is used as the clock to a flip flop 60 whose data input is qualifying signal D. This qualifying signal D is produced by a hysteresis comparator circuit whose output changes state whenever the magnitude of its input, signal A, exceeds the hysteresis level. The hysteresis voltage threshold is provided to this circuit by input HSTH, which is taken through a resistive voltage divider from the fully rectified read voltage signals supported by capacitor CHS. The time constant of the CHS/voltage divider circuit should be chosen to be long enough to substantially support the HSTH voltage level during a valid string of contiguous zeros, but short enough to allow the HSTH voltage level to fall during a dropout (which takes longer than a valid string of zeros).

Flip flop 60 operates as follows: its output takes on the same state as input D whenever input C has a low to high edge; this eliminates unqualified pulses in signal C. The output of flip flop 60, signal E, is fed to Bi-directional O.S. 70, which converts the transitions of signal E into pulses; the output of Bi-Dir O.S. 70 is then input to MUX 80. The output of MUX 80 is then used as an input to AND gate 90, which produces Read Data Pulses (RDP) F.

Figure 3:
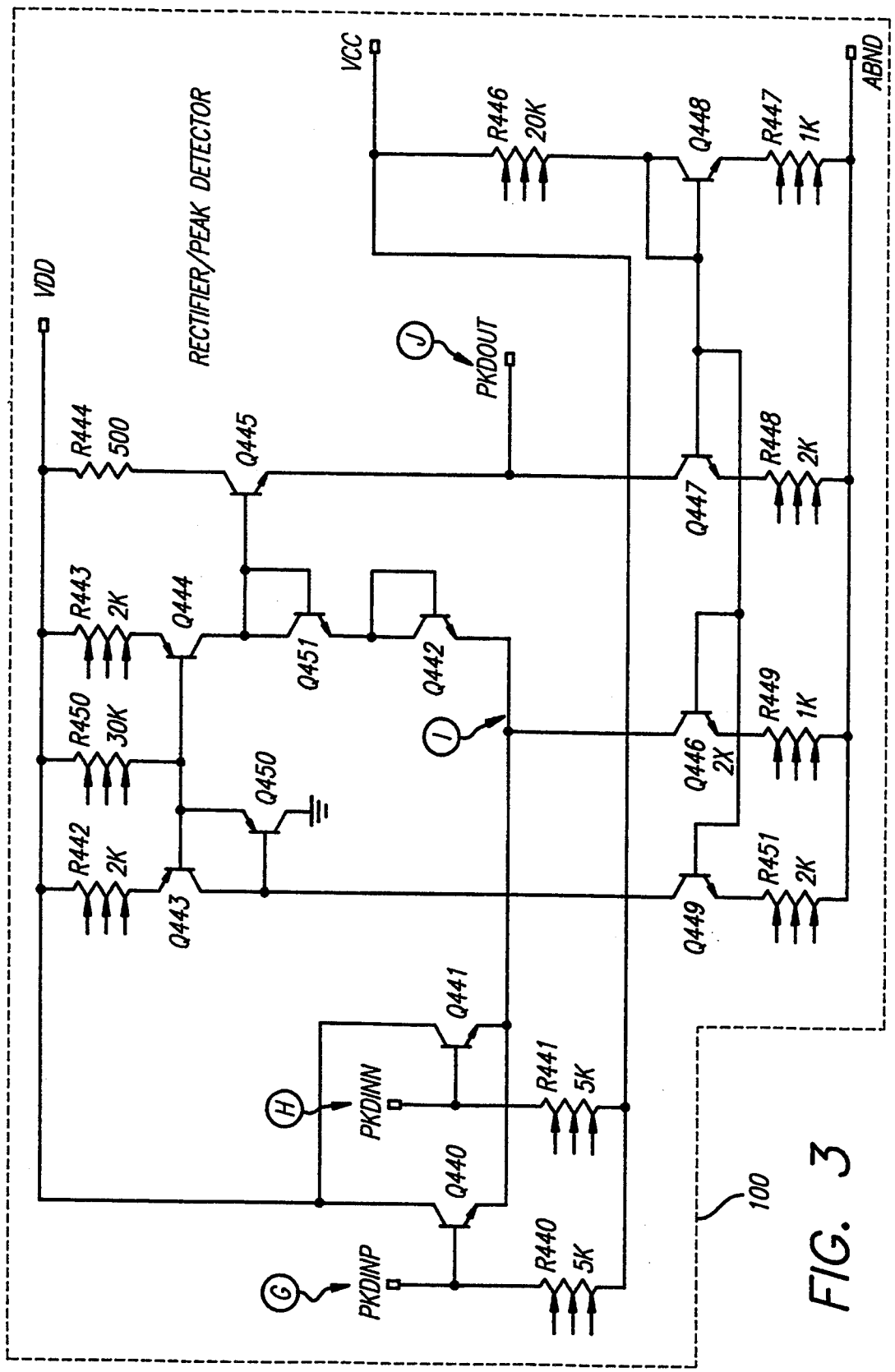
FIG. 3 is a schematic circuit diagram of peak detector 100 of FIG. 1.

The operation of the amplitude qualifying circuitry and the dropout detection circuitry will be explained in detail with reference also to FIGS. 3 and 4. FIG. 3 shows a circuit diagram for a peak detector 100 of FIG. 1. The pair of signals selected by MUX 10 in FIG. 1 go through a gain amplifier 110 to produce differential inputs G and H to peak detector 100. In FIG. 3, G and H pass through transistors Q440 and Q441, respectively, which act as full wave rectifiers, passing only the positive going pulse of G or H; this results in signal I. Signal I is buffered and amplified through a number of other transistors and produces PKDout, signal J. In FIG. 1, signal J is shown connected through a capacitor CPKD 120 to ground. Capacitor CPKD 120 holds the voltage of signal J up between pulses, but discharges substantially during a dropout. Signal J is applied as signal K to an input to the dropout detection circuitry, which is shown in detail in FIG. 4.

Figure 4:
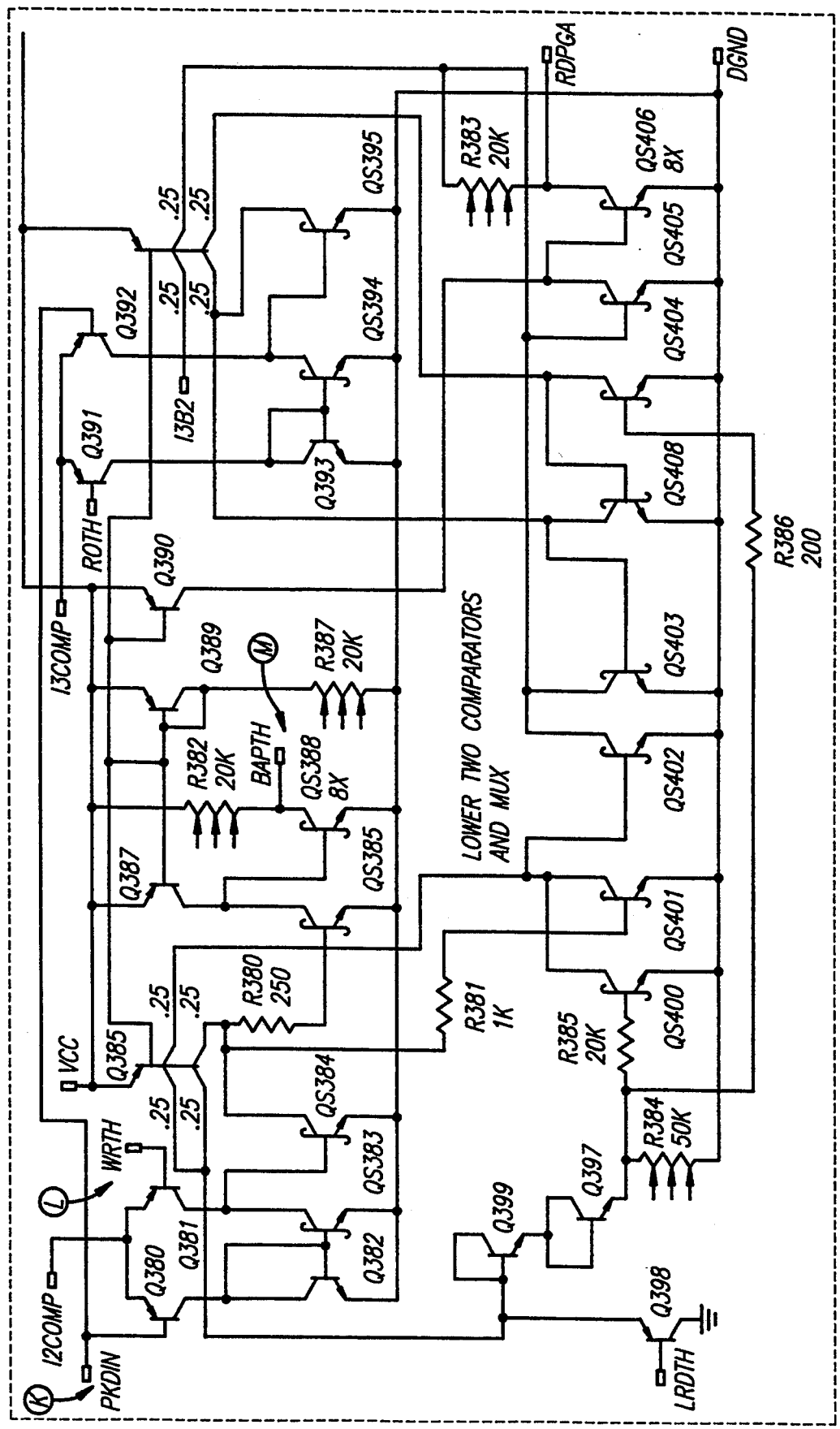
FIG. 4 is a circuit diagram of portion 130 of FIG. 1.
Figure 5A:
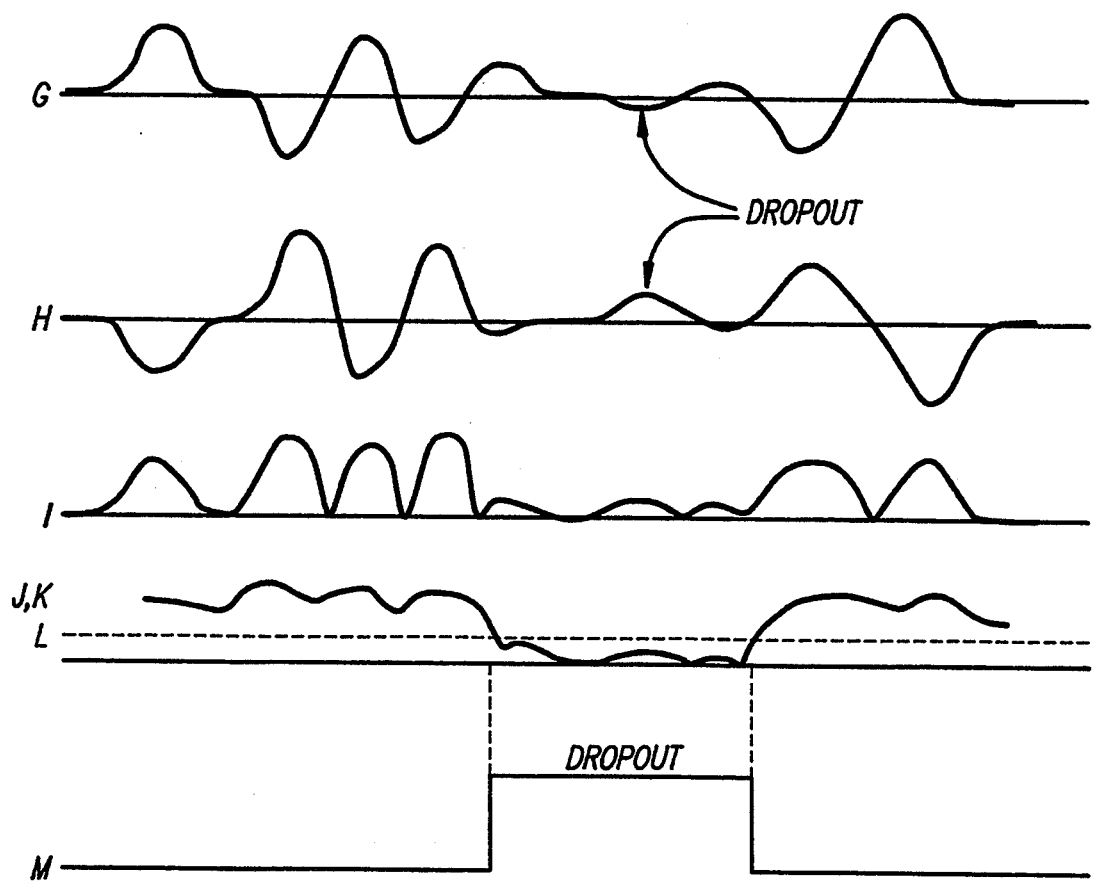
FIG. 5a shows signal waveforms at selected points of the circuits of FIGS. 3 and 4 during a dropout.
Figure 5B:
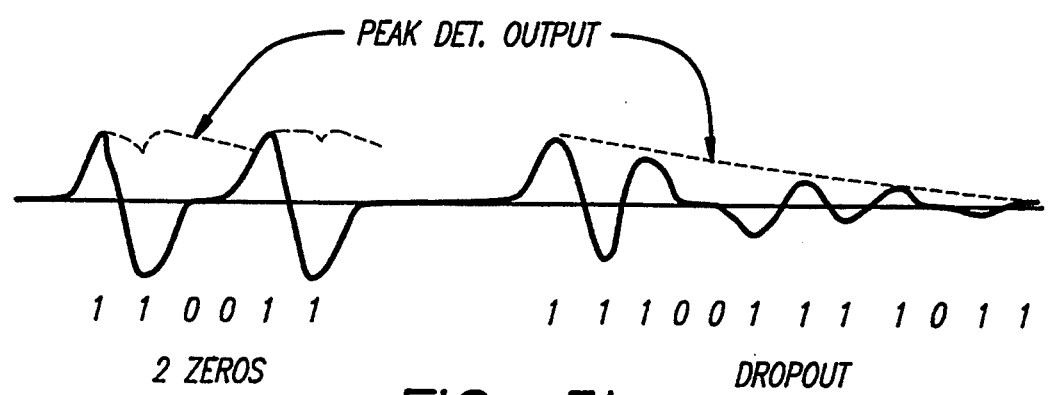
FIG. 5b shows an analog read voltage signal having two contiguous 0s and an analog read voltage signal experiencing dropout.

In the circuit of FIG. 4, which corresponds to the dashed block 130 of FIG. 1, signal K is compared to a dropout threshold signal L by transistors Q380 and Q381, which act as a comparator with output being Gapth signal M. This signal M goes high during a dropout period, and is low otherwise. In the preferred embodiment the dropout threshold signal is set at 30% of the reference voltage. Referring back to FIG. 1, when signal M goes high, MUX 80 selects signal C as the source of signal F, bypassing flip flop 60 and Bi-Dir O.S. 70, which enforce the amplitude qualification. FIG. 5a shows waveforms of signals G-M, both during normal read signals and during a period of dropout. Thus, periods of dropout can be recognized so that the amplitude qualification can be suspended during these periods. The dropout shown in FIG. 5 is not entirely to scale. Typically, a dropout takes at least ten times as long to occur as does a normal two zeros in a row, as shown in FIG. 5b, so the time constant of the dropout detection circuitry can be adjusted to distinguish these two cases.

Resolution Dependent Errors

In addition to errors caused by dropout, other errors can be caused when the signal resolution is at either extreme. Signals with a resolution of less than about 38% are vulnerable to an error whenever an isolated tri-bit pattern is encountered. This vulnerability is exacerbated when the hysteresis setting is high. In this situation the center bit of a tri-bit pattern may be attenuated by pulse crowding and as a result its amplitude may fail to qualify. At the opposite end of the resolution scale, signals with resolution greater than 90% are vulnerable to errors when low frequency patterns are encountered; a low hysteresis setting may allow the previously mentioned larger overshoots associated with high resolution to qualify as pulses.

Figure 6A:
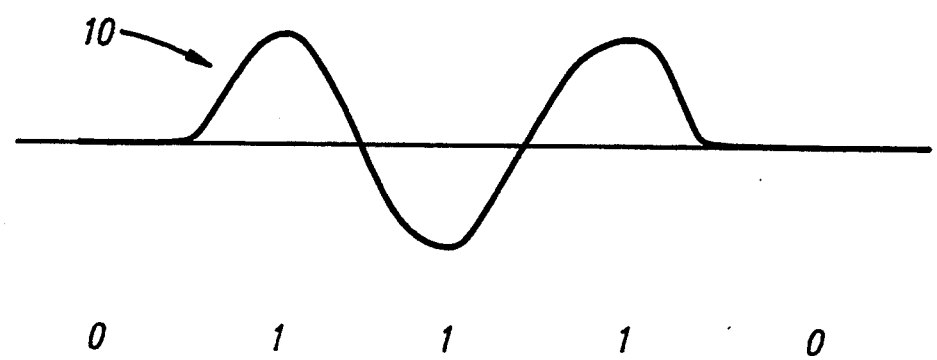
FIGS. 6a and 6b are waveform graphs showing a proper form of read voltage signal corresponding to a GCR tri-bit pattern, and a typical erroneous form of read voltage signal corresponding to a GCR tri-bit pattern, respectively.
Figure 6B:
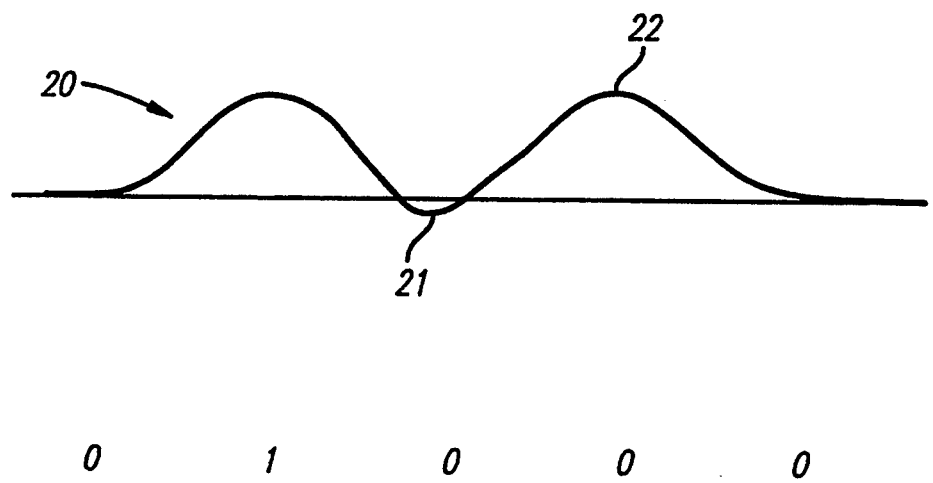

FIGS. 6a & b and 7a & b illustrate these problems. FIG. 6a shows an example of a proper voltage signal 10 representing the tri-bit sequence 01110. FIG. 6b shows a voltage signal 20 that should also represent 01110, but the center bit 21 is attenuated so much by pulse crowding that its amplitude is too small to be accepted by the amplitude qualifier, so a zero is registered at that point. Because the peak detection circuitry is still looking for a negative peak, the peak 22 of the last 1 of the tri-bit pattern is also registered as a zero, resulting in a bit pattern of 01000 being erroneously read.

Figure 7A:
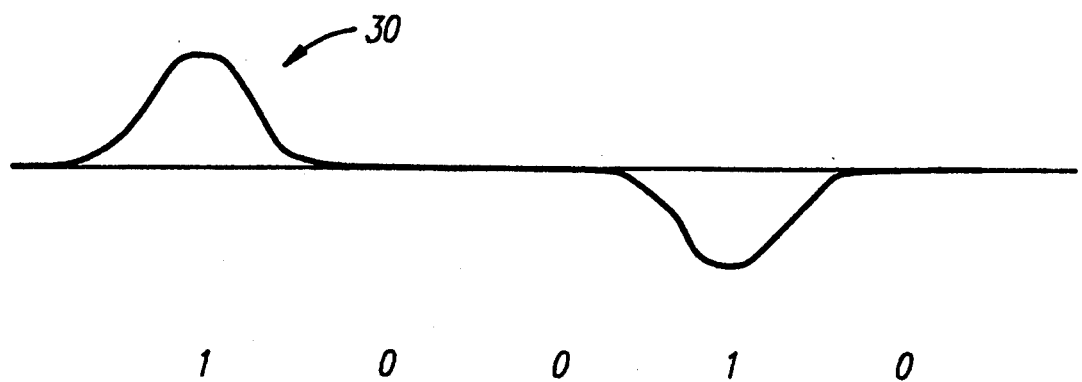
FIGS. 7a and 7b are waveform graphs showing a proper form of read voltage signal corresponding to a GCR low frequency bit pattern, and a typical erroneous form of read voltage signal corresponding to a GCR low frequency bit pattern, respectively.
Figure 7B:
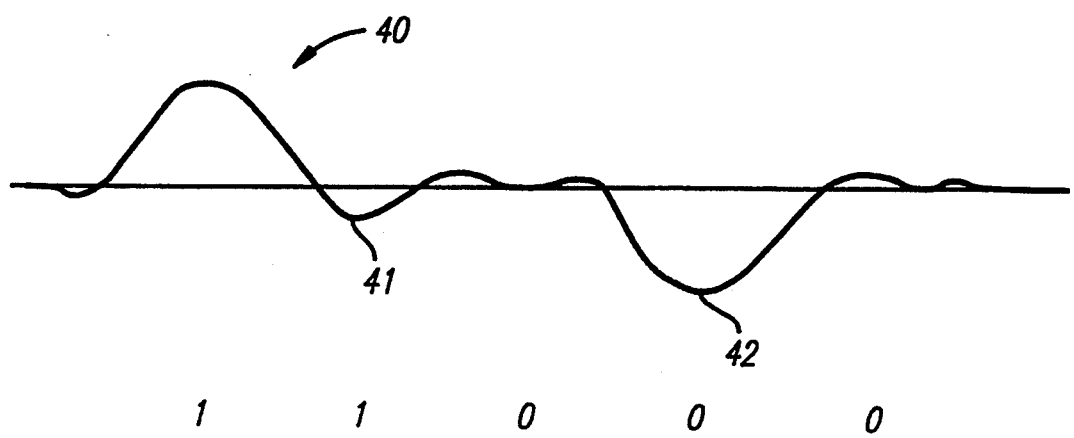

FIG. 7a shows an example of a proper voltage signal 30 representing the low frequency bit sequence 10010. FIG. 7b shows a voltage signal 40 that should also represent 10010, but a noise pulse or an overshoot 41 may be large enough to be accepted as a pulse by an amplitude qualifier with a low hysteresis setting, so a one is registered at that point. Because the peak detection circuitry is now looking for a positive peak, the negative peak 42 of the last 1 of the low frequency pattern is registered as a zero, resulting in a bit pattern of 11000 being erroneously read.

Experiments have indicated that the reading of invalid codes 01000 and 11000 almost always arises from the situations described above. An error correction scheme has therefore been constructed for these errors based on that assumption. The simplest way to implement this error correction scheme is by use of a PAL. Provided below are boolean expressions in the PALASM description language, for a 16RP6 PAL. A "/" indicates logical NOT, "*" indicates logical AND, "+" indicates logical OR, and ":" indicates that the boolean expression will be executed by a common clock input. A0 is the input read stream (such as the RDP of FIG. 1), 00 to 05 are registers, with the output taken from 05. 06 is simply an intermediate logic step to simplify the equation for 07, which goes high when a correction is made. Note that 06 must be low for a correction to be made, which prevents a correction from being attempted during blank tape. If 07 is low, the circuit simply acts as a shift register which delays the read stream by 5 clock ticks. If 07 goes high, the type of correction made will be determined by the status of 05, which is a 0 immediately before correction for tri-bit errors, and which is a 1 immediately before correction for low-frequency errors. The equations are:

00 := A0
01 := 00
02 := 01
03 := 02+07
04 := 03+07*/05
05 := /05*04+/07*04
06 = /A0*/00+/04*/05
07 = /06*/01*/02*/03

A PAL programmed according to this logic will thus automatically correct the above specified tri-bit and low-frequency errors. Furthermore, when 07 goes high, register 05 may be sampled to indicate which type of error has occurred. Knowing that high hysteresis settings tend to increase tri-bit errors and that low hysteresis settings tend to increase low-frequency errors, the error type sample from 05 can be used to dynamically adjust the drive's hysteresis setting so as to minimize read errors. Also, some drives employ a tunable filter that can have its frequency response modified to increase the signal resolution; this is known as frequency boost or pulse slimming. Generally, too much boost is undesirable, but if high frequency (tri-bit) errors are encountered (these are exacerbated by low resolution) the frequency boost/pulse slimming may be increased.

It is to be understood that the above description is intended to be illustrative only and not restrictive. Many variations will be apparent to those of skill in the art upon reviewing the above description. For instance, the same techniques employed in the preferred embodiment could be directly adapted for high and low frequency errors of RLL codes other than GCR. Also, the invention applies to any recording using RLL encoding, not just recording on tape drives. The scope of the invention should, therefore, be determined with reference to the appended claims, along with the full scope of equivalents to which such claims are entitled.

What is claimed is:

1. In a circuit for reading bit data encoded by a run length limited code, an apparatus for detecting and correcting errors, including a first and second erroneous data groups, in a data stream, said data stream may have high and low resolution data pulses, said apparatus comprising:

means for providing a hysteresis threshold voltage setting;

means for detecting periods of dropout and periods other than said periods of dropouts in said data stream;

amplitude qualifying circuit means, coupled to the data stream, for qualifying said data pulses, said amplitude qualifying circuit means qualifies said data pulses based upon said hysteresis voltage threshold setting during said periods other than said periods of dropout detected by said detection means and qualifies said data pulses based upon a setting less than the hysteresis voltage threshold setting during said periods of dropout detected by said detection means; and means for detecting and correcting errors, said errors including said first and second erroneous data groups, in the data pulses qualified by said amplitude qualifying circuit means, comprising:

means for recognizing said first and second erroneous data groups in data pulses qualified by said amplitude qualifying circuit, and means, coupled to said recognizing means, for correcting the first erroneous data group when said data stream comprises low resolution data pulses and for correcting the second erroneous data group when said data stream comprises high resolution data pulses.

2. The apparatus of claim 1, wherein the run length limited code is a group code recording, and wherein the means for recognizing the first and second erroneous data groups recognizes the first erroneous data group which consists of bits 01000 and the correcting means corrects the first erroneous data group to an isolated tri-bit pattern consists of bits 01110; and wherein the means for recognizing the first and second erroneous data group recognizes the second erroneous data group which consists of bits 11000 and the correcting means corrects the second erroneous data group to a low frequency bit pattern consists of bits 10010.

3. An apparatus for reading bit data encoded by group code recording, comprising:
 a) means for analyzing a voltage read signal to produce a bit data stream, comprising:
  i) means for detecting peaks in the voltage read signal and producing output signals responsive thereto;
  ii) qualifying means, including means for comparing the peaks in the voltage read signal with a predetermined threshold signal, for preventing the detecting and producing means from producing corresponding one of said output signals when a peak is below said threshold signal;
  iii) means, including means for detecting dropouts in the voltage read signal, for disabling the prevention means during a dropout in the voltage read signal; and
  iv) data output means, coupled to the detecting and producing means, for outputting said data stream based upon said output signal;
 b) indicating means, responsive to the data output means, for recognizing and indicating a first erroneous data group comprising bits 01000 and for recognizing and indicating a second erroneous data group comprising bits 11000 in the data stream;
 c) correction means, responsive to the indicating means and the data output means, for correcting the first erroneous data group to bits 01110 and for correcting the second erroneous data group to bits 10010;
 d) adjusting means, coupled to the indicating means, for adjusting a read parameter setting in response to erroneous data groups indicated by the indicating means.

4. The apparatus of claim 3, wherein a pulse slimming operation is performed on said voltage read signal and wherein the read parameter setting is a setting which controls said pulse slimming operation.

5. The apparatus of claim 3, wherein the threshold signal is responsive to a reading by hysteresis setting and the read parameter setting controls said read hysteresis setting.

6. The apparatus of claim 5, wherein the adjusting means lowers the read hysteresis setting in response to the first erroneous data group being indicated.

7. The apparatus of claim 5, wherein the adjusting means raises the read hysteresis setting in response to the second erroneous data group being indicated.

8. An apparatus for reading bit data, comprising
 a) means for analyzing a voltage read signal to produce a bit data stream, said analyzing means being coupled to the voltage read signal and including:
  i) means for detecting peaks in the voltage read signal and producing output signals responsive thereto;
  ii) qualifying means, including means for comparing the peaks in the voltage read signal with a predetermined threshold signal, for preventing the detecting and producing means from producing corresponding one of said output signals when a peak is below said threshold signal;
  iii) means, including means for detecting dropouts in the voltage read signal, for disabling the prevention means during a dropout in the voltage read signal; and
  iv) data output means, coupled to the detecting and producing means, for outputting said data stream based upon said output signal;
 b) indicating means, responsive to the data output means, for recognizing and indicating an erroneous data group the data stream;
 c) adjusting means, responsive to the indicating means, for adjusting a read parameter setting in response to the erroneous data group being indicated by the indicating means.

9. A method for removing read errors in a digital magnetic recording system in which recorded data are encoded by run length limited encoding, comprising the steps of:

generating an analog voltage read signal representative of said recorded data;

generating a reference voltage representative of the amplitude of the analog voltage read signal;

generating a first digital signal having a plurality of pulses each corresponding to a peak of said analog voltage read signal;

qualifying said pulses by comparing the amplitude of said analog voltage read signal to that of said reference voltage;

selecting pulses from said first digital signal when the amplitude of said analog voltage read signal is greater than that of said reference voltage, thereby forming a second digital signal representing a corrected signal detecting a dropout in analog voltage read signal; and lowering said reference voltage in response to said detected dropout.

10. The method of claim 9 further comprises the steps of:

detecting tri-bit patterns in said analog voltage read signal having an attenuated center bit;

correcting said second digital signal in response to a detected tri-bit pattern; and, adjusting said reference voltage to a lower level in response to said detecting step.

11. The method of claim 10 further comprising the steps of:

detecting a low frequency bit pattern having an overshoot condition in said analog voltage read signal;

correcting said second digital signal in response to a detection of said low frequency bit pattern; and, adjusting said reference voltage to a higher level in response to said detection of said low frequency bit pattern to reduce subsequent overshoot conditions.

* * * * *